United States Patent
Horng et al.

(10) Patent No.: US 8,574,938 B2
(45) Date of Patent: Nov. 5, 2013

(54) USING ISOLATED EPITAXIAL STRUCTURES IN GLUE BONDING FOR MULTIPLE GROUP-III NITRIDE LEDS ON A SINGLE SUBSTRATE

(75) Inventors: Ray-Hua Horng, Taichung (TW); Yi-An Lu, Chiayi (TW)

(73) Assignees: NCKU Research and Development Foundation, Tainan (TW); Phostek, Inc., Hsinchu (TW)

( * ) Notice: Subject to any disclaimer, the term of this patent is extended or adjusted under 35 U.S.C. 154(b) by 109 days.

(21) Appl. No.: 13/185,950

(22) Filed: Jul. 19, 2011

(65) Prior Publication Data

US 2013/0023074 A1    Jan. 24, 2013

(51) Int. Cl.
*H01L 21/00* (2006.01)
(52) U.S. Cl.
USPC ........... 438/29; 438/33; 438/34; 257/E33.068
(58) Field of Classification Search
None
See application file for complete search history.

(56) References Cited

U.S. PATENT DOCUMENTS

| | | | |
|---|---|---|---|
| 2005/0062061 A1* | 3/2005 | Horng et al. | 257/103 |
| 2009/0014738 A1* | 1/2009 | Shiue et al. | 257/98 |
| 2009/0127575 A1* | 5/2009 | Horng et al. | 257/98 |

* cited by examiner

*Primary Examiner* — Daniel Whalen
(74) *Attorney, Agent, or Firm* — Huffman Law Group, P.C.

(57) ABSTRACT

A method for forming a plurality of semiconductor light emitting devices includes forming an epitaxial layer having a first type doped layer, a light emitting layer, and a second type doped layer on a first temporary substrate. The epitaxial layer is separated into a plurality of epitaxial structures on the first temporary substrate. A second temporary substrate is coupled to the epitaxial layer with a first adhesive layer and the first temporary substrate is removed from the epitaxial layer. A permanent semiconductor substrate is coupled to the epitaxial layer with a second adhesive layer. The second temporary substrate and the first adhesive layer are removed from the epitaxial layer. The permanent semiconductor substrate is separated into a plurality of portions with each portion corresponding to at least one of the plurality of epitaxial structures to form a plurality of semiconductor light emitting devices.

12 Claims, 8 Drawing Sheets

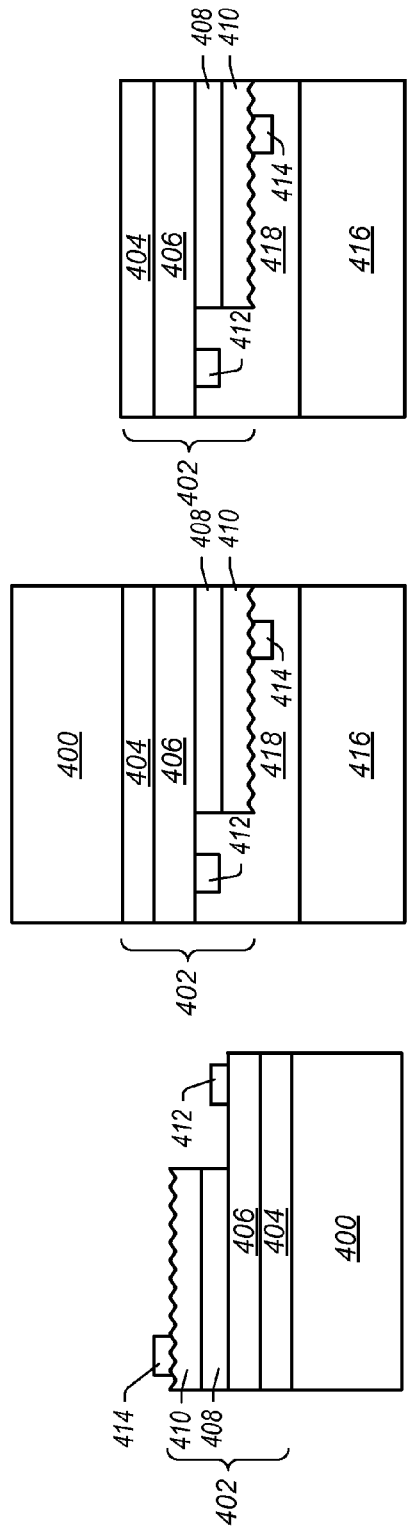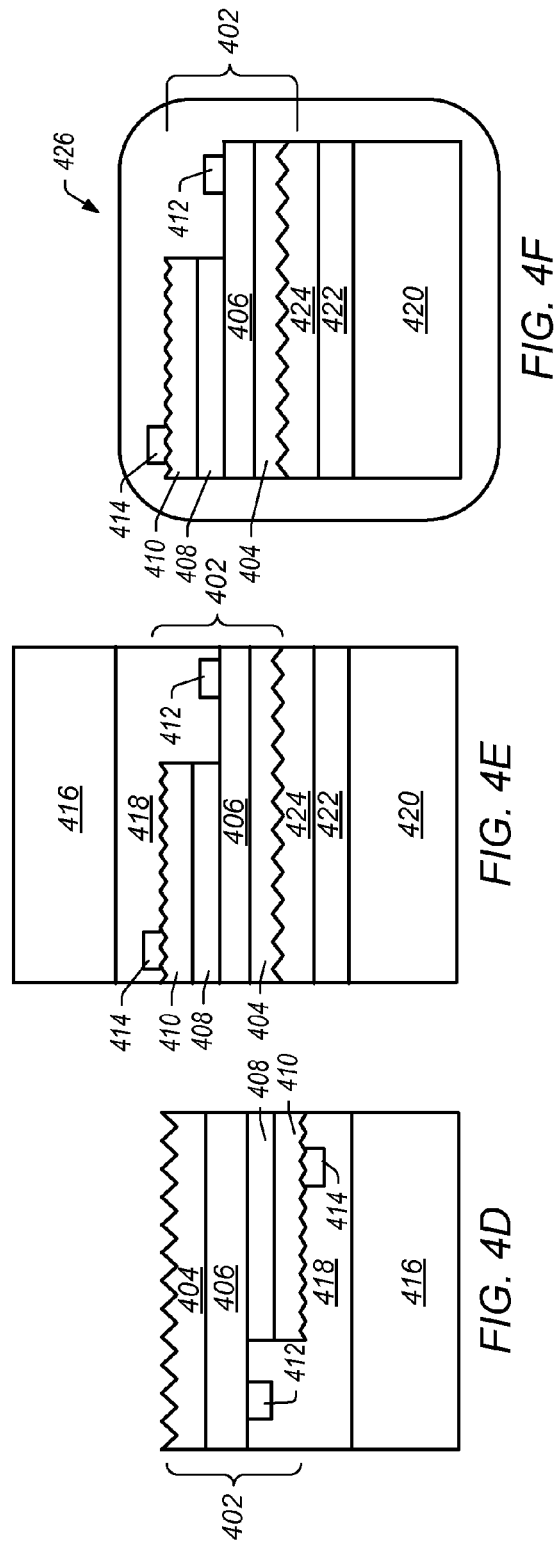

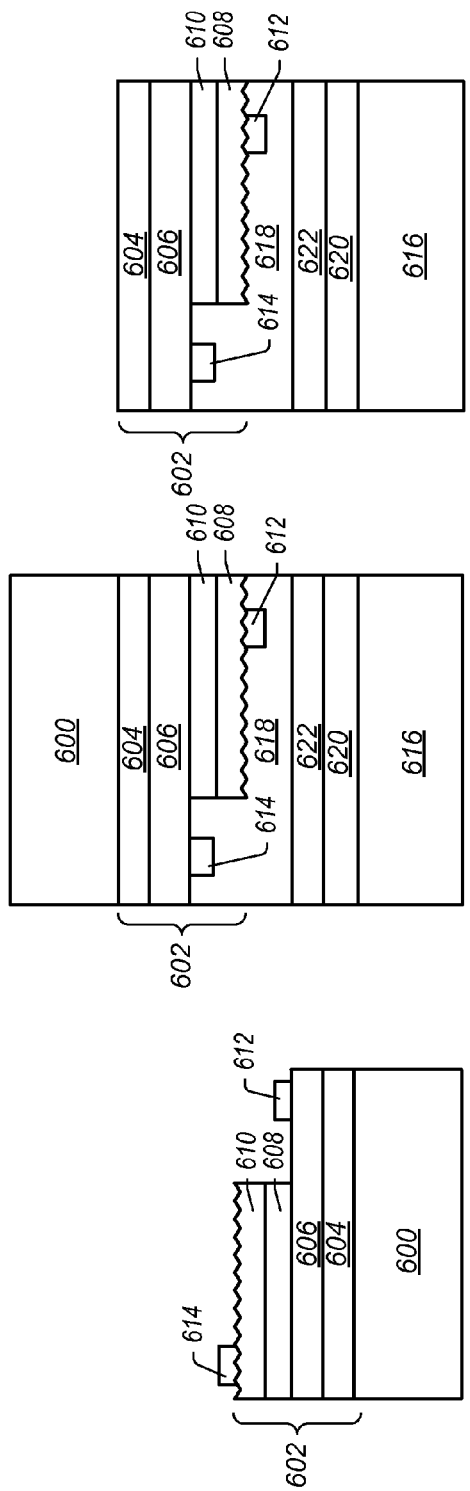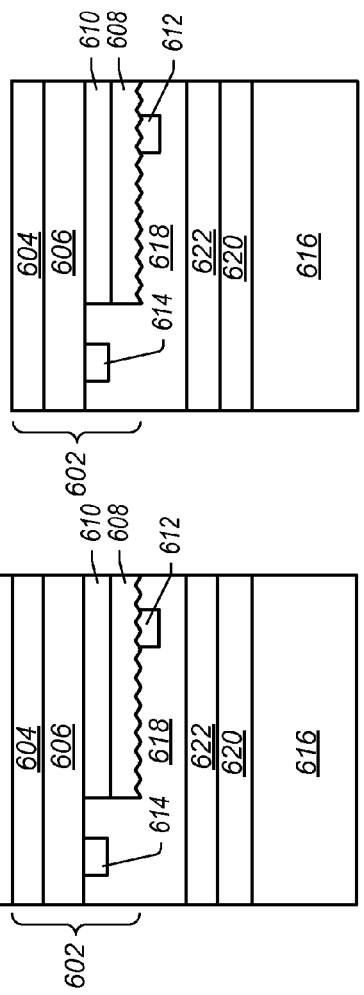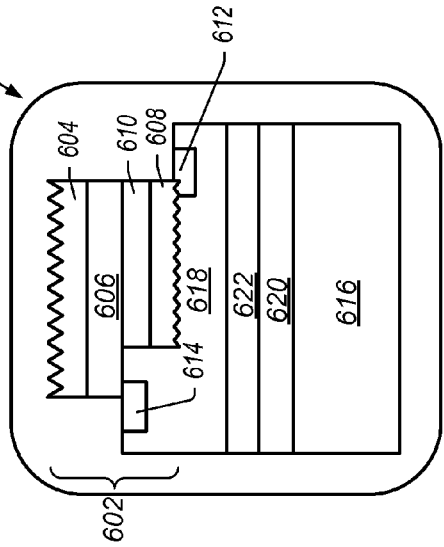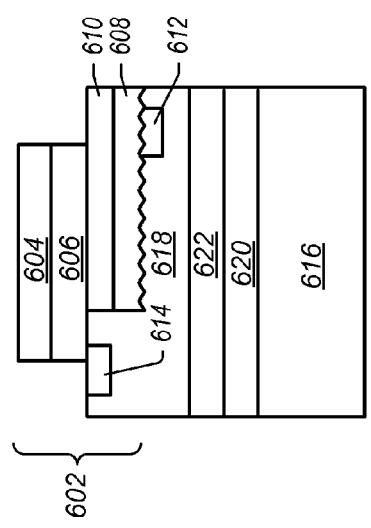

USING ISOLATED EPITAXIAL STRUCTURES IN GLUE BONDING FOR MULTIPLE GROUP-III NITRIDE LEDS ON A SINGLE SUBSTRATE

BACKGROUND

1. Field of the Invention

The present invention relates to a semiconductor light emitting component, and more particularly to a method for manufacturing a plurality of semiconductor light emitting devices.

2. Description of Related Art

FIG. 1 illustrates a schematic view of a conventional horizontal light emitting diode. Referring to FIG. 1, horizontal light emitting diode 100 includes epitaxial substrate 102. Epitaxial structure 104 is grown from the epitaxial substrate by an epitaxial growth process. Electrode unit 106 is formed on the epitaxial structure for providing electrical energy. Epitaxial substrate 102 is made of a material such as sapphire or SiC so that epitaxial growth of group-III nitride (e.g., gallium-nitride-based (GaN-based) or indium-gallium-nitride-based (InGaN-based) semiconductor material) can be achieved on epitaxial substrate 102.

Epitaxial structure 104 is usually made of GaN-based semiconductor material or InGaN-based semiconductor material. During the epitaxy growth process, GaN-based semiconductor material or InGaN-based semiconductor material epitaxially grows up from epitaxial substrate 102 to form n-type doped layer 108 and p-type doped layer 110. When the electrical energy is applied to epitaxial structure 108, light emitting portion 112 at junction of n-type doped layer 108 and p-type doped layer 110 generates an electron-hole capture phenomenon. As a result, the electrons of light emitting portion 112 will fall to a lower energy level and release energy with a photon mode. For example, light emitting portion 112 is a multiple quantum well (MQW) structure capable of restricting a spatial movement of the electrons and the holes. Thus, a collision probability of the electrons and the holes is increased so that the electron-hole capture phenomenon occurs easily, thereby enhancing light emitting efficiency.

Electrode unit 106 includes first electrode 114 and second electrode 116. First electrode 114 and second electrode 116 are in ohmic contact with n-type doped layer 108 and p-type doped layer 110, respectively. The electrodes are configured to provide electrical energy to epitaxial structure 104. When a voltage is applied between first electrode 114 and second electrode 116, an electric current flows from the second electrode to the first electrode through epitaxial substrate 102 and is horizontally distributed in epitaxial structure 104. Thus, a number of photons are generated by a photoelectric effect in epitaxial structure 104. Horizontal light emitting diode 100 emits light from epitaxial structure 104 due to the horizontally distributed electric current.

A manufacturing process of horizontal light emitting diode 100 is simple. However, horizontal light emitting diodes can cause several problems such as, but not limited to, current crowding problems, non-uniformity light emitting problems, and thermal accumulation problems. These problems may decrease the light emitting efficiency of the horizontal light emitting diode and/or damage the horizontal light emitting diode.

To overcome some of the above mentioned problems, vertical light emitting diodes have been developed. FIG. 2 illustrates a schematic view of a conventional vertical light emitting diode. Vertical light emitting diode 200 includes epitaxial structure 204 and electrode unit 206 disposed on the epitaxial structure for providing electrical energy. Similar to horizontal light emitting diode 100 shown in FIG. 1, epitaxial structure 204 can be made of GaN-based semiconductor material or InGaN-based semiconductor material by an epitaxial growth process. During the epitaxial growth process, the GaN-based semiconductor material and the InGaN-based semiconductor material epitaxially grows up from an epitaxial substrate (not shown) to form n-type doped layer 208, light emitting structure 212, and p-type doped layer 210. Then, electrode unit 206 is bonded to epitaxial structure 204 after stripping the epitaxial substrate. Electrode unit 206 includes first electrode 214 and second electrode 216. First electrode 214 and second electrode 216 are in ohmic contact with n-type doped layer 208 and p-type doped layer 210, respectively. In addition, second electrode 216 can adhere to heat dissipating substrate 202 so as to increase the heat dissipation efficiency. When a voltage is applied between first electrode 214 and second electrode 216, an electric current vertically flows. Thus, conventional vertical light emitting diode 200 can effectively improve the current crowding problem, the non-uniformity light emitting problem and the thermal accumulation problem of horizontal light emitting diode 100. However, a shading effect of the electrodes is a problem in the conventional vertical light emitting diode depicted in FIG. 2. In addition, the manufacturing process for forming vertical light emitting diode 200 may be complicated. For example, epitaxial structure 204 may be damaged by high heat when adhering second electrode 216 to heat dissipating substrate 202.

In recent years, wide-bandgap nitride-based LEDs with wavelength range from the ultraviolet to the shorter wavelength parts of the visible spectra have been developed. LED devices can be applied to new display technologies such as traffic signals, liquid crystal display TVs, and backlights of cell phones. Due to the lack of native substrates, GaN films and related nitride compounds are commonly grown on sapphire wafers. Conventional LEDs (such as those described above) are inefficient because the photons are emitted in all directions. A large fraction of light emitted is limited in the sapphire substrate and cannot contribute to usable light output. Moreover, the poor thermal conductivity of the sapphire substrate is also a problem associated with conventional nitride LEDs. Therefore, freestanding GaN optoelectronics without the use of sapphire is a desirable technology that solves this problem. The epilayer transferring technique is a well-known innovation in achieving ultrabright LEDs. Thin-film p-side-up GaN LEDs with highly reflective reflector on silicon substrate made by a laser lift-off (LLO) technique, combined with n-GaN surface roughening, have been established as an effective tool for nitride-based heteroepitaxial structures to eliminate the sapphire constraint. The structure is regarded as a good candidate for enhancing the light extraction efficiency of GaN-based LEDs. However, this technique is also subject to the electrode-shading problem. The emitted light is covered and absorbed by the electrodes, which results in reduced light efficiency.

Thin-film n-side-up devices GaN LEDs with interdigitated imbedded electrodes may improve light emission by reducing some of the electrode-shading problem. While thin-film n-side-up devices GaN LEDs provide enhanced properties compared to thin-film p-side-up devices GaN LEDs, there is still a need for improved structures and processes for making both p-side-up and n-side-up devices.

SUMMARY

In certain embodiments, a method for forming a plurality of semiconductor light emitting devices includes forming an epitaxial layer on a first temporary substrate. The epitaxial layer includes a first type doped layer, a light emitting layer, and a second type doped layer. The epitaxial layer is separated into a plurality of epitaxial structures on the first temporary substrate. A second temporary substrate is coupled to an upper surface of the epitaxial layer with a first adhesive layer. The first temporary substrate is removed from the epitaxial layer to expose a bottom surface of the epitaxial layer. A permanent semiconductor substrate is coupled to the bottom surface of the epitaxial layer with a second adhesive layer. The second temporary substrate and the first adhesive layer are removed from the upper surface of the epitaxial layer. The permanent semiconductor substrate is separated into a plurality of portions with each portion corresponding to at least one of the plurality of epitaxial structures to form a plurality of semiconductor light emitting devices.

In some embodiments, the epitaxial layer is diced to separate the epitaxial layer into the plurality of epitaxial structures. In some embodiments, the permanent semiconductor substrate is diced to separate the permanent semiconductor substrate into the plurality of portions. In some embodiments, a laser is used to separate the epitaxial layer into the plurality of epitaxial structures. In some embodiments, a laser is used to separate the permanent semiconductor substrate into the plurality of portions. In some embodiments, the epitaxial structures are used as a guide for dicing the permanent semiconductor substrate.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIGS. 4A-F depict an embodiment of a method for making a p-side up LED.

FIGS. 6A-E depict an embodiment of a method for making an n-side up LED.

Figure 1:
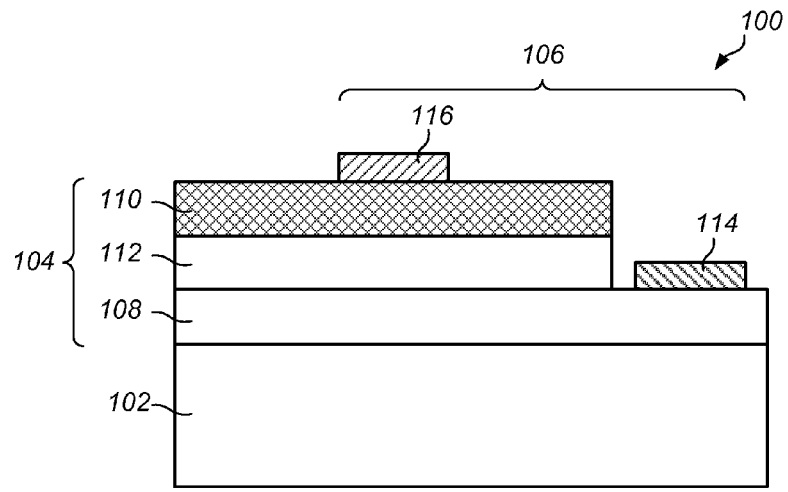
FIG. 1 illustrates a schematic view of a conventional horizontal light emitting diode.
Figure 2:
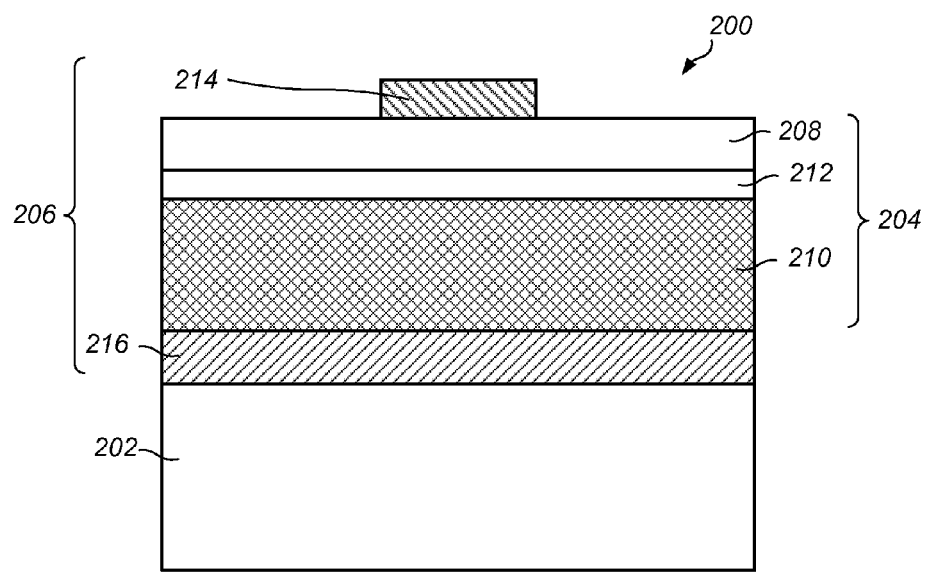
FIG. 2 illustrates a schematic view of a conventional vertical light emitting diode.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In the context of this patent, the term "coupled" means either a direct connection or an indirect connection (e.g., one or more intervening connections) between one or more objects or components.

Figure 3:
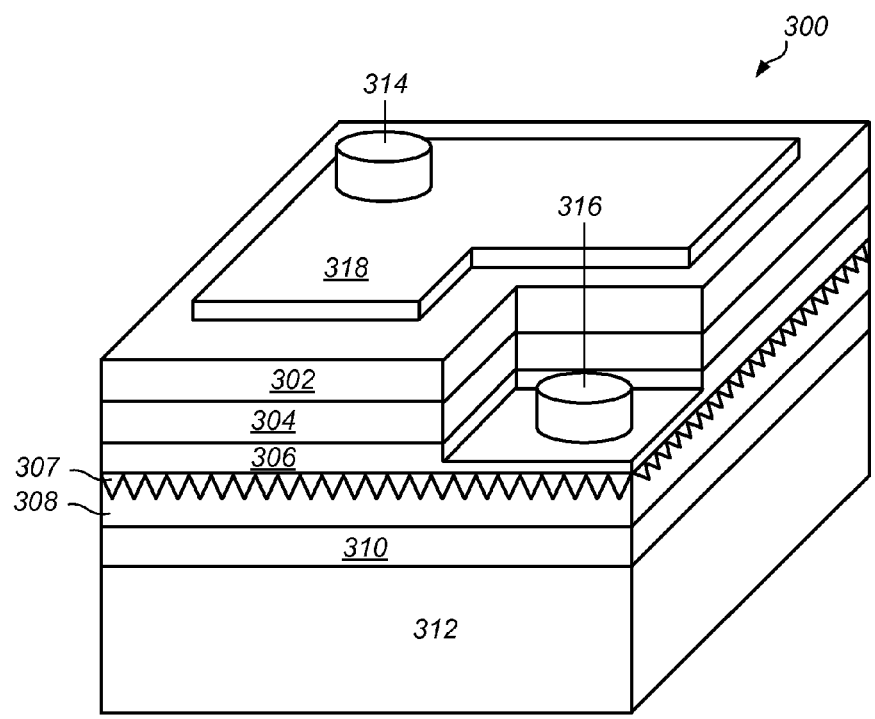
FIG. 3 depicts an embodiment of a p-side up thin film GaN (gallium nitride) LED.

FIG. 3 depicts an embodiment of a p-side up thin film GaN (gallium nitride) LED. P-side up LED 300 includes p-doped layer GaN layer 302, light emitting layer 304, and n-doped GaN layer 306. Light emitting layer 304 may be, for example, a multiple quantum well layer. In some embodiments, undoped GaN layer 307 is coupled to the bottom surface of n-doped layer 306. Layer 307 may be an epitaxial buffer layer. In some embodiments, layer 302 has a roughened upper surface and/or layer 307 has a roughened lower surface (e.g., a surface roughened by wet etching). Roughening of the surfaces may increase light emission efficiency of the layers.

The lower surface of layer 307 is bonded to reflective layer 310 with adhesive layer 308. Reflective layer 310 may be attached to substrate 312. Adhesive layer 308 may be a glue material with a low refractive index (e.g., refractive index of about 1.4). Reflective layer 310 may include a distributed Bragg reflector (DBR), an omni-directional reflector (ODR), silver, aluminum, titanium, and/or other reflective metals. Substrate 312 may include silicon, silicon oxide, metal, ceramic, polymer, or other suitable substrate materials with high thermal conductivity. Substrate 312 made of silicon may have a thermal conductivity of, for example, about 168 W/mK.

First electrode 314 and second electrode 316 may be formed on p-doped layer 302 and n-doped layer 306, respectively. Thus, first electrode 314 is a contact for layer 302 and second electrode 316 is a contact for layer 306. Because electrodes 314, 316 are formed on top of layers 302, 306, the electrodes may shade portions of the underlying layers and reduce the light emitting efficiency of LED 300. In some embodiments, layer 318 is formed on top of p-doped layer 302. Layer 318 may be a transparent conducting layer for current spreading. For example, layer 318 may include indium tin oxide (ITO). The upper surface of layer 318 may be roughened.

FIGS. 4A-F depict an embodiment of a method for making a p-side up LED such as LED 300. FIG. 4A depicts epitaxial structure 402 formed on first substrate 400. First substrate 400 may be a temporary substrate such as a sapphire substrate.

Epitaxial structure 402 may be formed on first substrate 400 using conventional epitaxial techniques known in the art such as metal organic chemical vapor deposition (MOCVD). Epitaxial structure 402 may include undoped layer 404, first doped layer 406, light emitting layer 408, and second doped layer 410. In certain embodiments, undoped layer 404, first doped layer 406, light emitting layer 408, and second doped layer 410 are gallium nitride (GaN) layers formed in multiple deposition processing steps.

Light emitting layer 408 may be, for example, a multiple quantum well layer. In certain embodiments, first doped layer 406 is an n-type doped layer and second doped layer 410 is a p-type doped layer. In some embodiments, the upper surface of second doped layer 410 is roughened by, for example, wet etching. A portion of the upper surface of first doped layer 406 may be exposed by patterning of light emitting layer 408 and second doped layer 410. First electrode 412 may be formed on an upper surface of first doped layer 406. Second electrode 414 may be formed on an upper surface of second doped layer 410. The size and shape of electrodes 412 and 414 may be defined using a photolithography process.

After formation of epitaxial structure 402 on first substrate 400, the upper surface of the structure may be bonded to second substrate 416 with first adhesive layer 418, as shown in FIG. 4B. Before or after the bonding process, the device may be flipped upside down, as shown in FIG. 4B, such that undoped layer 404 is at the top of epitaxial structure 402 and second doped layer 410 is at the bottom of the structure. Second substrate 416 may be a temporary substrate (for example, a glass substrate, sapphire, or other insulating material type substrate). First adhesive layer 418 may be, for example, an epoxy glue, wax, SOG (spin-on-glass), photoresist, monomer, polymer, or any glue type material known in the art for bonding GaN layers to ceramic or glass layers. In certain embodiments, epitaxial structure 402 is bonded to second substrate 416 using first adhesive layer 418 at temperatures between about 200° C. and about 300° C. and pressures between about 5 kg force and about 30 kg force for a 2 inch substrate.

Following bonding to second substrate 416, first substrate 400 is removed from epitaxial structure 402, as shown in FIG. 4C. First substrate 400 may be removed using, for example, a laser lift-off (LLO) process. Removal of first substrate 400 exposes the, now, upper surface of undoped layer 404. In certain embodiments, upper surface of undoped layer 404 is roughened, as shown in FIG. 4D. The upper surface of undoped layer 404 may be roughened using, for example, a wet etching process.

The structure depicted in FIG. 4D may then be bonded to third substrate 420 with second adhesive layer 424, as shown in FIG. 4E. Before or after the bonding process, the device may be flipped upside down, as shown in FIG. 4E, such that third substrate 420 is at the bottom of the structure. In certain embodiments, third substrate 420 includes reflective layer 422 on an upper surface of the substrate. Third substrate 420 may be, for example, a silicon oxide substrate or other suitable thermally conductive substrate. Third substrate 420 may be the permanent substrate for epitaxial structure 402. Reflective layer 422 may include aluminum, titanium, and/or other reflective conducting materials. Second adhesive layer 424 may be the same or different from first adhesive layer 418. For example, in some embodiments, first adhesive layer 418 is an ether-based compound and second adhesive layer 424 is a silicone-based or imide-based compound. In certain embodiments, bonding with second adhesive layer 418 occurs at temperatures between about 150° C. and about 200° C. and pressures between about 300 kg force and about 400 kg force for a 2 inch substrate.

Following bonding to third substrate 420, first adhesive layer 418 is removed from epitaxial structure 402 to remove the first adhesive layer and second substrate 416 from the epitaxial structure, as shown in FIG. 4F. First adhesive layer 418 and second substrate 416 may be removed using, for example, a LLO process, an acid etching process, or another suitable etching process. The resulting structure, shown in FIG. 4F, is p-side up LED 426. P-side up LED 426 is an LED with second doped (p-type doped) layer 410 at the top of epitaxial structure 402 and electrodes 412, 414 exposed for use as contact pads.

Figure 5:
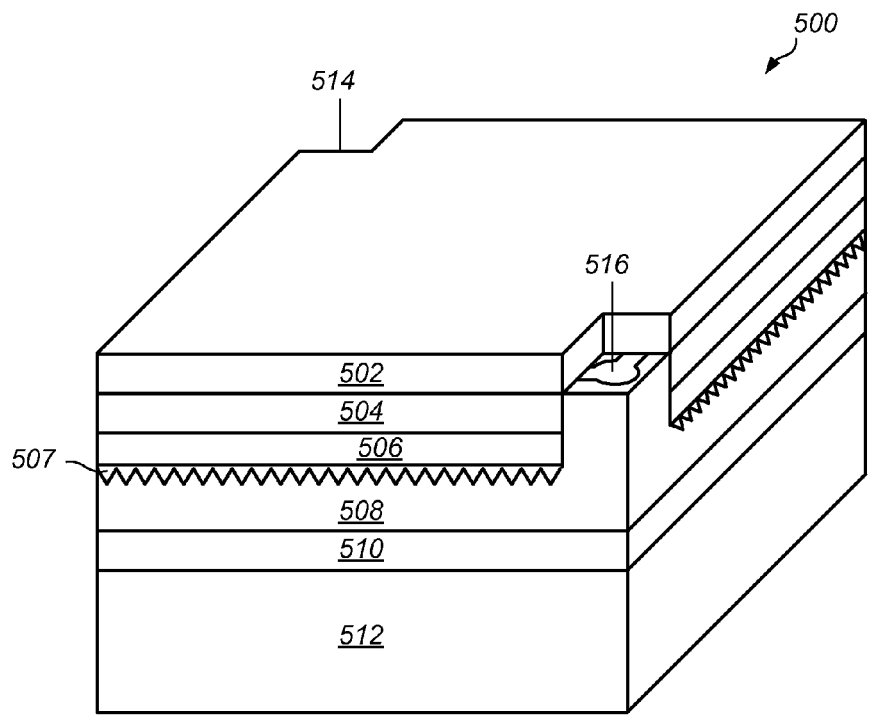
FIG. 5 depicts an embodiment of an n-side up thin film GaN (gallium nitride) LED.

FIG. 5 depicts an embodiment of an n-side up thin film GaN (gallium nitride) LED. N-side up LED 500 includes n-doped layer GaN layer 502, light emitting layer 504, and p-doped GaN layer 506. Light emitting layer 504 may be, for example, a multiple quantum well layer. In some embodiments, undoped GaN layer 507 is coupled to the bottom surface of p-doped layer 506. Layer 507 may be an epitaxial buffer layer. In some embodiments, layer 502 has a roughened upper surface and/or layer 507 has a roughened lower surface (e.g., a surface roughened by wet etching). Roughening of the surfaces may increase light emission efficiency of the layers.

The lower surface of layer 507 is bonded to reflective layer 510 with adhesive layer 508. Reflective layer 510 may be attached to substrate 512. Adhesive layer 508 may be a glue material with a low refractive index (e.g., refractive index of about 1.4). Reflective layer 510 may include aluminum, titanium, and/or other reflective metals. Substrate 512 may include silicon, silicon oxide, or other suitable substrate materials with high thermal conductivity. Substrate 512 made of silicon may have a thermal conductivity of, for example, about 168 W/mK.

First electrode 514 and second electrode 516 may be formed on p-doped layer 506 and n-doped layer 502, respectively. Thus, first electrode 514 is a contact for layer 506 and second electrode 516 is a contact for layer 502. Electrodes 514, 516 may be imbedded in LED 500 such that there is no electrode shading, thus increasing the emission efficiency of the LED.

FIGS. 6A-E depict an embodiment of a method for making an n-side up LED such as LED 500. FIG. 6A depicts epitaxial structure 602 formed on first substrate 600 (e.g., a temporary substrate). First substrate 600 may be, for example, a sapphire substrate. Epitaxial structure 602 may be formed on first substrate 600 using conventional epitaxial techniques known in the art such as metal organic chemical vapor deposition (MOCVD). Epitaxial structure 602 may include undoped layer 604, first doped layer 606, light emitting layer 608, and second doped layer 610. In certain embodiments, undoped layer 604, first doped layer 606, light emitting layer 608, and second doped layer 610 are gallium nitride (GaN) layers formed in multiple deposition processing steps.

Light emitting layer 608 may be, for example, a multiple quantum well layer. In certain embodiments, first doped layer 606 is an n-type doped layer and second doped layer 610 is a p-type doped layer. In some embodiments, the upper surface of second doped layer 610 is roughened by, for example, wet etching. A portion of the upper surface of first doped layer 606 may be exposed by patterning of light emitting layer 608 and second doped layer 610. First electrode 612 may be formed on an upper surface of first doped layer 606. Second electrode 614 may be formed on an upper surface of second doped layer 610. The size and shape of electrodes 612 and 614 may be defined using a photolithography process.

After formation of epitaxial structure 602 on first substrate 600, the upper surface of the structure may be bonded to second substrate 616 with first adhesive layer 618, as shown in FIG. 6B. Before or after the bonding process, the device may be flipped upside down, as shown in FIG. 6B, such that undoped layer 604 is at the top of epitaxial structure 602 and second doped layer 610 is at the bottom of the structure. Second substrate 616 may be, for example, a silicon substrate or other suitable thermally conductive substrate. Second substrate 616 may be the permanent substrate for epitaxial structure 602. In certain embodiments, second substrate 616 includes reflective layer 620 and/or insulating layer 622 on an upper surface of the substrate. Reflective layer 620 may include aluminum, titanium, and/or other reflective conducting materials. Insulating layer 622 may include oxides, nitrides, and/or other suitable electrically insulating materials with high light transparency. First adhesive layer 618 may be, for example, an epoxy glue or any glue type material known in the art for bonding GaN layers to silicon or silicon oxide layers.

Following bonding to second substrate 616, first substrate 600 is removed from epitaxial structure 602, as shown in FIG. 6C. First substrate 600 may be removed using, for example, a laser lift-off (LLO) process. Removal of first substrate 600 exposes the, now, upper surface of undoped layer 604.

Following removal of first substrate 600, portions of undoped layer 604 and first doped layer 606 are removed to expose at least part of first electrode 612 and at least part of second electrode 614, as shown in FIG. 6D. Portions of undoped layer 604 and first doped layer 606 may be removed using, for example, an anisotropic etching process such as inductively coupled plasma (ICP) reactive ion etching (RIE).

In certain embodiments, upper surface of undoped layer 604 is roughened, as shown in FIG. 6E. The upper surface of undoped layer 604 may be roughened using, for example, a wet etching process (e.g., a sodium hydroxide wet-etching process or a phosphoric acid wet etching process). The resulting structure, shown in FIG. 6E, is n-side up LED 624. N-side up LED 624 is an LED with first doped (n-type doped) layer 610 at the top of epitaxial structure 602 and electrodes 612, 614 exposed for use as contact pads with the electrodes not shading light emitting layer 608.

In certain embodiments, multiple LEDs (e.g., multiple epitaxial structures) are formed on a single substrate. The multiple epitaxial structures may be formed simultaneously on the single substrate by forming the multiple epitaxial structures from a single group of layers epitaxially deposited on the substrate. For example, epitaxial layers (e.g., the doped/undoped layers and the light emitting layer) are formed (e.g., using MOCVD) across the entire substrate and then the layers are divided into sections to form the multiple epitaxial structures. Forming multiple LEDs simultaneously may reduce the effects of process variation during formation of the LEDs and produce LEDs with more uniform properties.

There are, however, potential problems with forming multiple LEDs on a single substrate, especially with multiple LEDs formed using the epilayer transferring technique (e.g., transferring the epitaxial structures from a sapphire substrate to a silicon substrate as described above). One of the potential problems includes cracking of the epitaxial structures due to the high pressures (e.g., above about 9.8 MPa) applied to the structures during the bonding process. Other potential problems include mixing of adhesives if two or more bonding processes are used and gaps exist between the epitaxial structures, generation of voids in an adhesive layer, difficulty in reducing the thickness of an adhesive layer, and/or floating of epitaxial structures during the bonding process.

Figure 7:
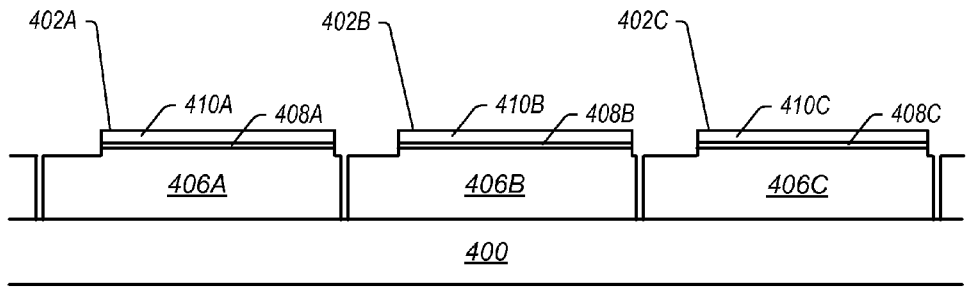
FIG. 7 depicts an embodiment of multiple epitaxial structures separated on a first substrate.

FIGS. 7-12 depict an embodiment of a process for forming multiple p-side up GaN LEDs on a single substrate using an epilayer transfer technique with the LEDs isolated before transferring of the substrates. FIG. 7 depicts an embodiment of multiple epitaxial structures 402A, 402B, 402C on first substrate 400. First substrate 400 may be, for example, a sapphire substrate on which epitaxial structures 402A, 402B, 402C are formed. Epitaxial structures 402A, 402B, and 402C may be formed on first substrate 400 using conventional epitaxial techniques known in the art such as metal organic chemical vapor deposition (MOCVD). Epitaxial structures 402A, 402B, 402C may include, respectively, first doped layers 406A, 406B, 406C, light emitting layers 408A, 408B, 408C, and second doped layers 410A, 410B, 410C. In certain embodiments, undoped layers are located between second doped layers 410A, 410B, 410C and first substrate 400.

Light emitting layers 408A, 408B, 408C may be, for example, multiple quantum well layers. In certain embodiments, first doped layers 406A, 406B, 406C are n-type doped layers and second doped layers 410A, 410B, 410C are p-type doped layers. In some embodiments, the upper surface of second doped layers 410A, 410B, 410C are roughened by, for example, wet etching. A portion of the upper surfaces of first doped layers 406A, 406B, 406C may be exposed by patterning of light emitting layers 408A, 408B, 408C and second doped layers 410A, 410B, 410C such that electrodes may be placed on the upper surfaces of the first doped layers. Thus, epitaxial structures 402A, 402B, 402C may be p-side up GaN LED structures.

Separated (isolated) epitaxial structures may be formed by depositing the epitaxial layers used in the epitaxial structures across the substrate and subsequently separating (or isolating) sections of the deposited layers to form the separated (isolated) epitaxial structures such as epitaxial structures 402A, 402B, 402C depicted in FIG. 7. A dicing or cutting saw or a laser may be used to separate the epitaxial layers and form separated epitaxial structures 402A, 402B, 402C on first substrate 400. In some embodiments, an etching process is used to separate the epitaxial layers and form separated epitaxial structures 402A, 402B, 402C on first substrate 400.

Figure 8:
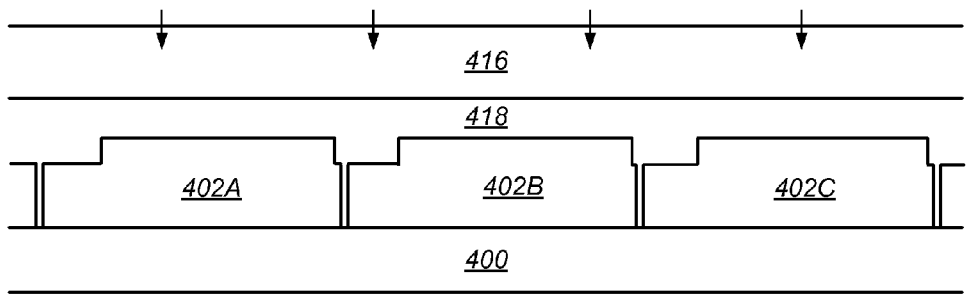
FIG. 8 depicts the embodiment of FIG. 7 bonded to a second substrate with a first adhesive layer.

Following formation of separated epitaxial structures 402A, 402B, 402C on first substrate 400, the upper surface of the epitaxial structures may be bonded to second substrate 416 with first adhesive layer 418, as shown in FIG. 8. For simplicity in the drawings epitaxial structures 402A, 402B, 402C are referenced without the details of the individual layers in the epitaxial structures in FIGS. 8-12. In certain embodiments, second substrate 416 is a glass substrate and first adhesive layer 418 is an epoxy glue. As shown in FIG. 8, first adhesive layer 418 may flow into the gaps between epitaxial structures 402A, 402B, 402C.

Figure 9:
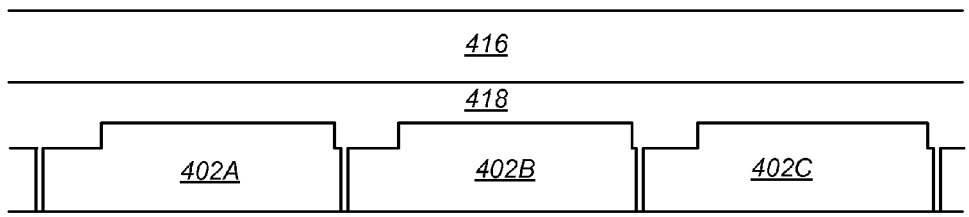
FIG. 9 depicts the embodiment of FIG. 8 with the first substrate removed from the epitaxial structures.

Following bonding to second substrate 416, first substrate 400 is removed from epitaxial structures 402A, 402B, 402C, as shown in FIG. 9. First substrate 400 may be removed using, for example, a laser lift-off (LLO) process. In some embodiments, the exposed surface of epitaxial structures 402A, 402B, 402C is roughened by, for example, a wet etching process.

Figure 10:
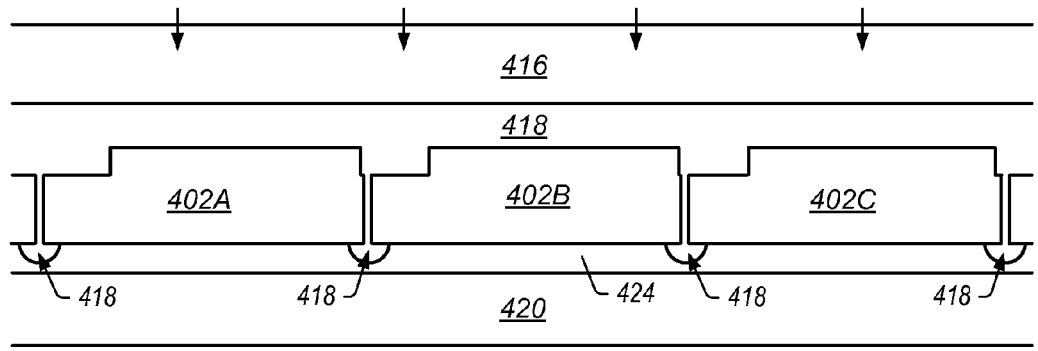
FIG. 10 depicts the embodiment of FIG. 9 with a third substrate bonded to the epitaxial structures with a second adhesive layer.

After removal of first substrate 400, third substrate 420 may be bonded to epitaxial structures 402A, 402B, 402C with second adhesive layer 424, as shown in FIG. 10. In certain embodiments, third substrate 420 includes a reflective layer between the substrate and second adhesive layer 424. Third substrate 420 may be, for example, a silicon oxide substrate or other suitable thermally conductive substrate. Third substrate 420 may be the permanent substrate for epitaxial structures 402A, 402B, 402C.

In some embodiments, as shown in FIG. 10, first adhesive layer 418 may mix with, or flow into, second adhesive layer 424 at or near the gaps between epitaxial structures 402A, 402B, 402C. This flow of first adhesive layer 418 into second adhesive layer 424 may be caused by the pressure applied at elevated temperatures during bonding using the second adhesive layer. For example, bonding using second adhesive layer 424 may take place at temperatures of at least about 200° C. and with applied pressures above about 9.8 MPa. At such temperatures and pressures, first adhesive layer 418 may mix with second adhesive layer 424 in the gaps between epitaxial structures 402A, 402B, 402C because the adhesive layers contact each other in these gaps.

Figure 11:
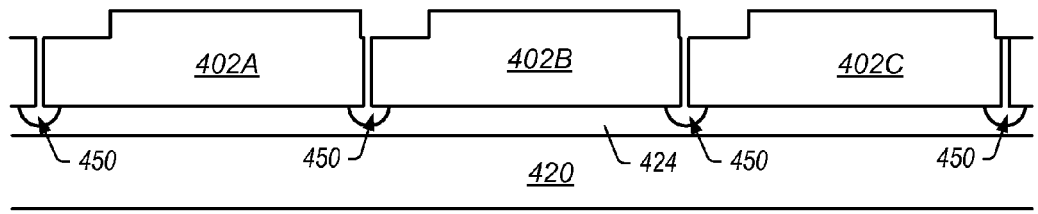
FIG. 11 depicts the embodiment of FIG. 10 with the first adhesive layer and the second substrate removed from the epitaxial structures.

Because of the mixing of first adhesive layer 418 with second adhesive layer 424, voids 450 may be formed in the second adhesive layer when the first adhesive layer and second substrate 416 are removed from epitaxial structures 402A, 402B, 402C, as shown in FIG. 11. First adhesive layer 418 and second substrate 416 may be removed from epitaxial structures 402A, 402B, 402C using, for example, an acid etching process. Voids 450 are formed at or near the gaps between epitaxial structures 402A, 402B, 402C. These voids may contribute to cracking of epitaxial layers in epitaxial structures 402A, 402B, 402C during subsequent processing. For example, the epitaxial layers may crack during wire bonding of contact pads as the wire bonding pads may be located above voids 450.

In certain embodiments, mixing of first adhesive layer 418 with second adhesive layer 424 is inhibited if the melting point of the first adhesive layer is higher than the melting point of the second adhesive layer. If the melting point of first adhesive layer 418 is higher than the melting point of second adhesive layer 424, the first adhesive layer may remain solidified during the bonding process using the second adhesive layer and inhibit mixing between the adhesive layers. Thus, if the melting point of first adhesive layer 418 is higher than the melting point of second adhesive layer 424, formation of voids 450, depicted in FIG. 11, may be inhibited.

Figure 12:
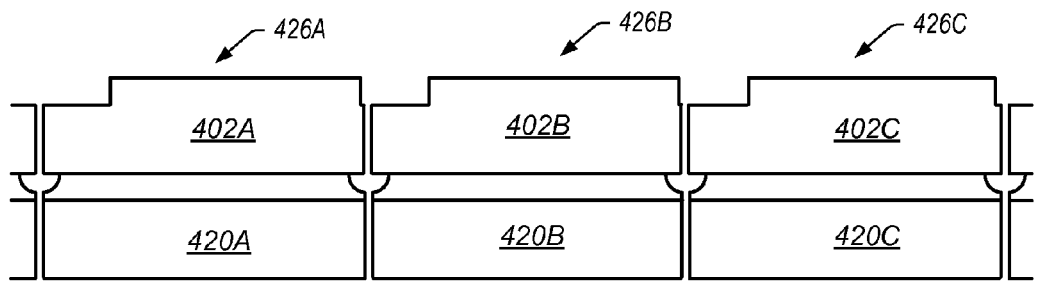
FIG. 12 depicts an embodiment of LEDs formed by separating the third substrate depicted in FIG. 11.

After removal of first adhesive layer 418 and second substrate 416 from epitaxial structures 402A, 402B, 402C, light emitting devices (LEDs) 426A, 426B, 426C may be formed by separating third substrate 420 in correspondence with epitaxial structures 402A, 402B, 402C, as shown in FIG. 12. Third substrate 420 may be separated using, for example, a dicing (cutting) saw or a laser. In some embodiments, an etching process is used to separate third substrate 420. Third substrate 420 is separated along lines that correspond to the gaps between epitaxial structures 402A, 402B, 402C. In some embodiments, epitaxial structures 402A, 402B, 402C are used as a guide for separating third substrate 420. Thus, LED 426A includes epitaxial structure 402A and substrate 420A, LED 426B includes epitaxial structure 402B and substrate 420B, and LED 426C includes epitaxial structure 402C and substrate 420C.

Figure 13:
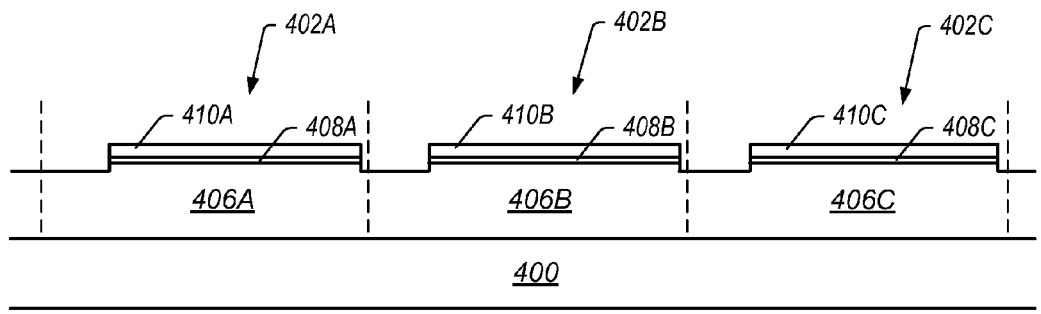
FIG. 13 depicts an embodiment of non-separated multiple epitaxial structures on a first substrate.

FIGS. 13-18 depict an embodiment of a process for forming multiple p-side up GaN LEDs on a single substrate using an epilayer transfer technique with the LEDs isolated after transferring of the substrates. FIG. 13 depicts an embodiment of multiple epitaxial structures 402A, 402B, 402C on first substrate 400. First substrate 400 may be, for example, a sapphire substrate on which epitaxial structures 402A, 402B, 402C are formed. Epitaxial structures 402A, 402B, and 402C may be formed on first substrate 400 using conventional epitaxial techniques known in the art such as metal organic chemical vapor deposition (MOCVD). Epitaxial structures 402A, 402B, 402C may include, respectively, first doped layers 406A, 406B, 406C, light emitting layers 408A, 408B, 408C, and second doped layers 410A, 410B, 410C. In certain embodiments, undoped layers are located between second doped layers 410A, 410B, 410C and first substrate 400.

Light emitting layers 408A, 408B, 408C may be, for example, multiple quantum well layers. In certain embodiments, first doped layers 406A, 406B, 406C are n-type doped layers and second doped layers 410A, 410B, 410C are p-type doped layers. In some embodiments, the upper surface of second doped layers 410A, 410B, 410C are roughened by, for example, wet etching. A portion of the upper surfaces of first doped layers 406A, 406B, 406C may be exposed by patterning of light emitting layers 408A, 408B, 408C and second doped layers 410A, 410B, 410C such that electrodes may be placed on the upper surfaces of the first doped layers.

As shown in FIG. 13, however, epitaxial structures 402A, 402B, 402C have not yet been separated or isolated. The dashed lines in FIG. 13 (and in FIGS. 14-17) represent the lines along which epitaxial structures 402A, 402B, 402C will later be separated. Thus, in FIGS. 13-17, first doped layers 406A, 406B, 406C are a continuous first doped layer while second doped layers 410A, 410B, 410C and light emitting layers 408A, 408B, 408C are separated due to the patterning to expose the upper surfaces of the first doped layers for electrodes.

Figure 14:
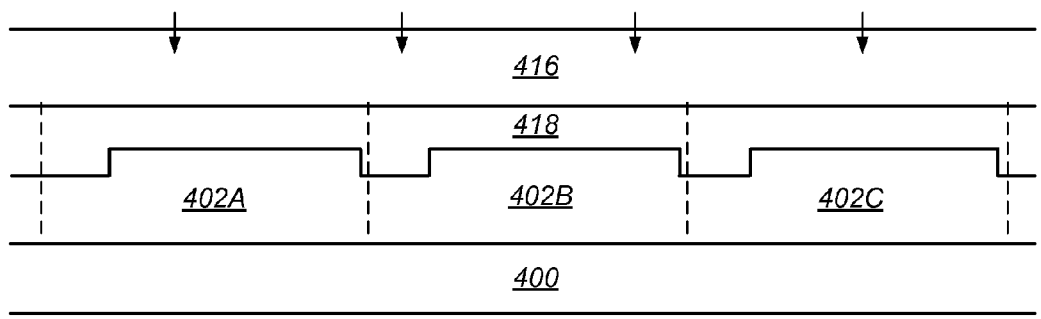
FIG. 14 depicts the embodiment of FIG. 13 bonded to a second substrate with a first adhesive layer.

Following formation of epitaxial structures 402A, 402B, 402C on first substrate 400, the upper surface of the epitaxial structures may be bonded to second substrate 416 with first adhesive layer 418, as shown in FIG. 14. For simplicity in the drawings epitaxial structures 402A, 402B, 402C are referenced without the details of the individual layers in the epitaxial structures in FIGS. 14-18. In certain embodiments, second substrate 416 is a glass substrate and first adhesive layer 418 is epoxy glue. As epitaxial structures 402A, 402B, 402C have not been separated, there are no gaps for first adhesive layer 418 to flow between the epitaxial structures.

Figure 15:
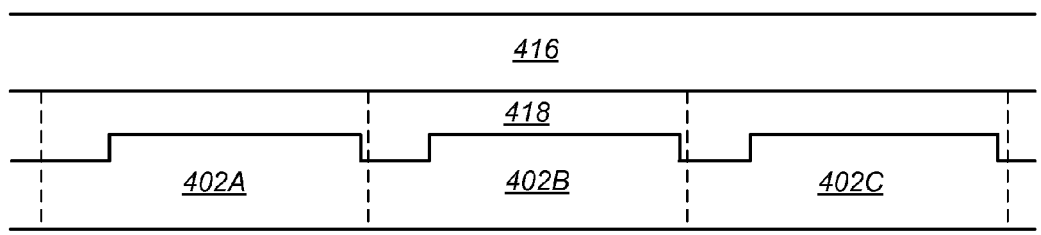
FIG. 15 depicts the embodiment of FIG. 14 with the first substrate removed from the epitaxial structures.

Following bonding to second substrate 416, first substrate 400 is removed from epitaxial structures 402A, 402B, 402C, as shown in FIG. 15. First substrate 400 may be removed using, for example, a LLO process. In some embodiments, the exposed surface of epitaxial structures 402A, 402B, 402C is roughened by, for example, a wet etching process.

Figure 16:
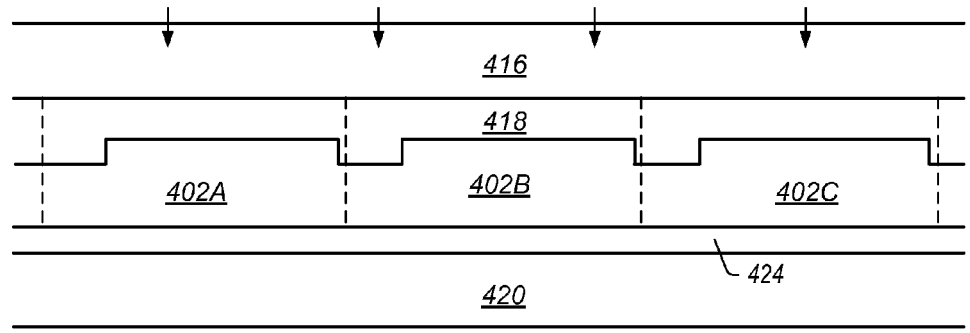
FIG. 16 depicts the embodiment of FIG. 15 with a third substrate bonded to the epitaxial structures with a second adhesive layer.

After removal of the first substrate, third substrate 420 may be bonded to epitaxial structures 402A, 402B, 402C with second adhesive layer 424, as shown in FIG. 16. In certain embodiments, third substrate 420 includes a reflective layer between the substrate and second adhesive layer 424. Third substrate 420 may be, for example, a silicon oxide substrate or other suitable thermally conductive substrate. Third substrate 420 may be the permanent substrate for epitaxial structures 402A, 402B, 402C.

There is relatively little or no potential for mixing between first adhesive layer 418 and second adhesive layer 424 during the bonding process shown in FIG. 16 because there are no gaps between epitaxial structures 402A, 402B, 402C. Additionally, there is no possibility for epitaxial structures 402A, 402B, 402C floating during either of the bonding processes because the epitaxial structures have not been separated. During the bonding process shown in FIG. 16, the pressure applied to epitaxial structures 402A, 402B, 402C may be increased to higher pressures than the embodiment described above in FIG. 10. The pressure can be increased to higher pressures because epitaxial structures 402A, 402B, 402C have not been separated and there is little or no potential for mixing of the glues between the epitaxial structures. Bonding at higher pressure may reduce the thickness of second adhesive layer 424 during and after the bonding process. Reducing the thickness of second adhesive layer 424 may increase the light emitting efficiencies of LEDs made from epitaxial structures 402A, 402B, 402C.

Figure 17:
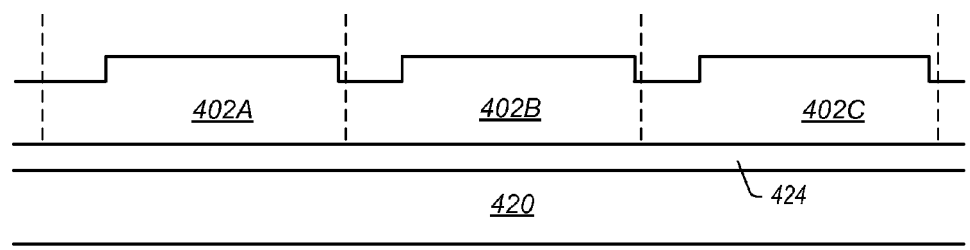
FIG. 17 depicts the embodiment of FIG. 16 with the first adhesive layer and the second substrate removed from the epitaxial structures.

After bonding of third substrate 420 to epitaxial structures 402A, 402B, 402C, first adhesive layer 418 and second substrate 416 are removed from the epitaxial structures, as shown in FIG. 17. First adhesive layer 418 and second substrate 416 may be removed using, for example, an LLO process or an acid etching process.

Figure 18:
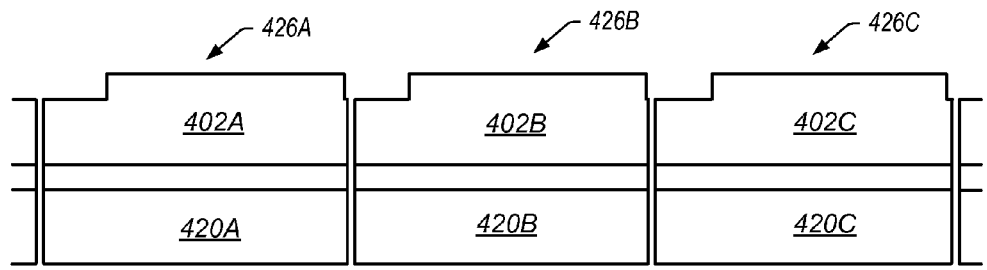
FIG. 18 depicts an embodiment of LEDs formed by separating the epitaxial structures and the third substrate depicted in FIG. 17.

After removal of first adhesive layer 418 and second substrate 416 from epitaxial structures 402A, 402B, 402C, the epitaxial structures and third substrate 420 are separated along the dashed lines (shown in FIG. 17) to form LEDs 426A, 426B, 426C, as shown in FIG. 18. Epitaxial structures 402A, 402B, 402C and third substrate 420 may be separated using, for example, a dicing (cutting) saw or a laser. In some embodiments, an etching process is used to separate epitaxial structures 402A, 402B, 402C and third substrate 420. As shown in FIG. 18, LED 426A includes epitaxial structure 402A and substrate 420A, LED 426B includes epitaxial structure 402B and substrate 420B, and LED 426C includes epitaxial structure 402C and substrate 420C.

As shown in the embodiment depicted in FIGS. 7-12 and the embodiment depicted in FIGS. 13-18, multiple LEDs may be formed on a single substrate using an epilayer transfer technique. In certain embodiments, the epitaxial layers in epitaxial structures 402A, 402B, 402C depicted in FIGS. 7-12 may be thinner than the epitaxial layers in epitaxial structures 402A, 402B, 402C depicted in FIGS. 13-18. The epitaxial layers in epitaxial structures 402A, 402B, 402C depicted in FIGS. 13-18 may have to be thicker to inhibit cracking of the epitaxial layers during the bonding process. For example, the portions of first doped layers 406A, 406B, 406C with exposed upper surfaces may have potential for cracking during the bonding process if the layers are too thin. Because of the gaps between epitaxial structures 402A, 402B, 402C depicted in FIGS. 7-12, the adhesive layers have area to flow into and relieve the pressure applied to the thinner areas of the epitaxial layers. This pressure relief may allow thinner epitaxial layers to be used.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming a plurality of semiconductor light emitting devices, comprising:

forming an epitaxial layer comprising a first type doped layer, a light emitting layer, and a second type doped layer on a first temporary substrate;

separating the epitaxial layer into a plurality of epitaxial structures on the first temporary substrate;

coupling a second temporary substrate to upper surfaces of the plurality of epitaxial structures with a first adhesive layer;

removing the first temporary substrate from the plurality of epitaxial structures to expose bottom surfaces of the plurality of epitaxial structures;

coupling a permanent semiconductor substrate to the bottom surfaces of the plurality of epitaxial structures with a second adhesive layer, wherein the second adhesive layer at least partially intermixes with the first adhesive layer proximate a gap between at least two of the epitaxial structures;

removing the second temporary substrate and the first adhesive layer from the upper surfaces of the plurality of epitaxial structures, wherein removal of the first adhesive layer at least partially intermixed with the second adhesive layer leaves at least one void in the second adhesive layer proximate the gap between the at least two epitaxial structures; and separating the permanent semiconductor substrate into a plurality of portions with each portion corresponding to at least one of the plurality of epitaxial structures to form the plurality of semiconductor light emitting devices.

2. The method of claim 1, wherein the plurality of epitaxial structures on the first temporary substrate comprises a plurality of separated epitaxial structures on the first temporary substrate.

3. The method of claim 1, further comprising separating the epitaxial layer into the plurality of epitaxial structures on the first temporary substrate before coupling the permanent semiconductor substrate to the bottom surfaces of the plurality of epitaxial structures with the second adhesive layer.

4. The method of claim 1, wherein the first type doped layer comprises n-type doped GaN and the second type doped layer comprises p-type doped GaN.

5. The method of claim 1, wherein the light emitting layer comprises a multiple quantum well structure.

6. The method of claim 1, wherein the epitaxial layer further comprises an undoped layer below the first type doped layer.

7. A method for forming a plurality of semiconductor light emitting devices, comprising:

forming an epitaxial layer comprising a first type doped layer, a light emitting layer, and a second type doped layer on a first temporary substrate;

separating the epitaxial layer into a plurality of epitaxial structures on the first temporary substrate;

coupling a second temporary substrate to upper surfaces of the plurality of epitaxial structures with a first adhesive layer;

removing the first temporary substrate from the plurality of epitaxial structures to expose bottom surfaces of the plurality of epitaxial structures;

coupling a permanent semiconductor substrate to the bottom surfaces of the plurality of epitaxial structures with a second adhesive layer, wherein the second adhesive layer is in contact with the first adhesive layer between at least two of the epitaxial structures, and wherein the first adhesive layer has a higher melting point than the second adhesive layer to inhibit intermixing between the adhesive layers;

removing the second temporary substrate and the first adhesive layer from the upper surfaces of the plurality of epitaxial structures; and separating the permanent semiconductor substrate into a plurality of portions with each portion corresponding to at least one of the plurality of epitaxial structures to form the plurality of semiconductor light emitting devices.

8. The method of claim 7, wherein the plurality of epitaxial structures on the first temporary substrate comprises a plurality of separated epitaxial structures on the first temporary substrate.

9. The method of claim 7, further comprising separating the epitaxial layer into the plurality of epitaxial structures on the first temporary substrate before coupling the permanent semiconductor substrate to the bottom surfaces of the plurality of epitaxial structures with the second adhesive layer.

10. The method of claim 7, wherein the first type doped layer comprises n-type doped GaN and the second type doped layer comprises p-type doped GaN.

11. The method of claim 7, wherein the light emitting layer comprises a multiple quantum well structure.

12. The method of claim 7, wherein the epitaxial layer further comprises an undoped layer below the first type doped layer.

\* \* \* \* \*